United States Patent [19]
Ohmine et al.

[11] Patent Number: 5,151,133
[45] Date of Patent: Sep. 29, 1992

[54] VAPOR DEPOSITION APPARATUS

[75] Inventors: Toshimitsu Ohmine, Tokyo; Keiichi Akagawa, Yamato; Akira Ishihata, Tokyo, all of Japan

[73] Assignee: Kabushiki Kaisha Toshiba, Kawasaki, Japan

[21] Appl. No.: 639,182

[22] Filed: Jan. 9, 1991

Related U.S. Application Data

[62] Division of Ser. No. 181,091, Apr. 13, 1988, Pat. No. 5,002,011.

Foreign Application Priority Data

| | | |
|---|---|---|
| Apr. 14, 1987 [JP] | Japan | 62-089715 |
| Sep. 25, 1987 [JP] | Japan | 62-238830 |
| Dec. 8, 1987 [JP] | Japan | 62-308627 |
| Dec. 8, 1987 [JP] | Japan | 62-308758 |

[51] Int. Cl.⁵ ............................. C23C 16/00
[52] U.S. Cl. ...................... 118/725; 118/715; 118/730
[58] Field of Search ............. 118/715, 725, 730

[56] References Cited

U.S. PATENT DOCUMENTS

| | | | |
|---|---|---|---|
| 3,594,227 | 7/1971 | Oswald | 118/730 |
| 4,108,107 | 8/1978 | Scheuermann | 118/730 |
| 4,596,208 | 6/1986 | Wolfson | 118/725 |
| 5,002,011 | 3/1991 | Ohmine | 118/730 |

*Primary Examiner*—Richard Bueker
*Attorney, Agent, or Firm*—Foley & Lardner

[57] ABSTRACT

A vapor deposition apparatus for forming thin films on substrates with reactive gases, by rotating and revolving the substrates while heating the substrates in a reactor vessel, comprises a hollow susceptor carrier rotatably disposed inside the reactor vessel, susceptors rotatably disposed on the susceptor carrier to hold the substrates respectively, a driving motor for rotating the susceptor carrier such that the substrates held by the susceptors are revolved with respect to the reactor vessel, and a converting mechanism for converting a rotation motion of the susceptor carrier rotated by the driving motor into a motion for rotating the susceptors together with the substrates around themselves. The converting mechanism is disposed within the hollow of the susceptor carrier.

14 Claims, 15 Drawing Sheets

FILM THICKNESS DISTRIBUTION
ORTHOGONAL TO FLOW

VAPOR DEPOSITION APPARATUS

This application is a division of application Ser. No. 07/181,091, filed Apr. 13, 1988 now U.S. Pat. No. 5,002,011.

BACKGROUND OF THE INVENTION

1. Field of the Invention

The present invention relates to a vapor deposition apparatus adopted for manufacturing compound semiconductor thin films on substrates, and particularly to a vapor deposition apparatus which smoothly rotates and revolves substrates to form thin films having uniform thickness distribution on the substrates.

2. Description of the Prior Art

There are several conventional vapor deposition apparatuses which are generally used to manufacture heterostructure compound semiconductors. Among such conventional apparatuses, FIGS. 1, 3 and 4 show vertical-type vapor deposition apparatuses, and FIG. 2 shows a horizontal-type vapor deposition apparatus.

In FIG. 1, a revolving turntable 5 is disposed in a silica reactor tube 1 and rotated by a motor 6. On the turntable 5, there are disposed a plurality of susceptors 4 made of graphite material, etc. A rack 4a formed on the periphery of each of the susceptors 4 engages with a gear 9. The gear 9 is rotated by a motor 7 to rotate the susceptors 4 and a plurality of substrates 3 respectively held by the susceptors 4. The susceptors 4 are heated by a high-frequency coil 2 disposed around the silica reactor tube 1 to heat the substrates.

While the susceptors 4 are being rotated and revolved with the temperature of the substrates 3 being maintained at a predetermined value, reactive gases, for instance organometallic gases such as $(CH_3)_3Ga$, $(CH_3)_3Al$ and $AsH_3$, are alternately or simultaneously supplied from a gas supplying port 10 to grow crystals on the substrates 3 which are maintained at the high temperature.

In such a vertical-type vapor deposition apparatus of the prior art, the susceptors 4 are generally heated to about 700° C. to 800° C. to grow the crystals. As a result, if the quantity of each reactive gas is small, heat convections are caused on the substrates 3 which generate vortexes that disturb the flows of the gases. If the flows are disturbed due to these vortexes, the surfaces for growing crystals will not provide heterostructures, leading to a deterioration in the electrical characteristics of the thin films to be formed on the substrates 3. Particularly, in growing ultrathin films, each having a crystal film thickness of several 10Å, the reactive gases would be quickly changed from one to another, thereby causing serious problems due to heat convections.

In the horizontal-type vapor deposition apparatus shown in FIG. 2, a revolving turntable 15 is disposed at the bottom of a reactor tube 11 and rotated by a motor 16. On the turntable 15 there are disposed a plurality of susceptors 14 each holding and rotating a substrate 13. A rack 14a is formed on the periphery of each of the susceptors 14 and engages with a gear 19. The gear 19 is rotated by a motor 17 to rotate the susceptors 14. The susceptors 14 are heated to a predetermined temperature by an infrared lamp 12 disposed outside the reactor tube 11, thereby increasing the temperature of the substrates 13 to a predetermined value. After that, reactive gases are supplied from a gas supplying port 20 in the same manner as described in the above to react and grow crystals on the substrates 13.

In this horizontal-type vapor deposition apparatus, the reactive gases flow horizontally to make a laminar flow such that the formation of vortexes are not so significant and the disturbance in the flow is relatively small. However, with respect to the gas supplying port 20, there is a large difference in the distance between a proximal portion and a distal portion of each of the substrates 13. Therefore, the crystal growing rates of the proximal and distal portions of the substrate 13 differ from each other, resulting in unevenness in the thickness distribution of the film formed on the substrate 13. Particularly, in forming an ultrathin film on the substrate, this problem is not solved even if the substrate is rotated and revolved because there are limits to the rotating and revolving speeds of the substrate and because reactive gases, each in small quantities, are changed from one to another in short time intervals before the substrate 13 can complete a single revolution. Namely, the reactive gases are changed from one to another at a more rapid rate than that of the rate of revolution for the substrate 13. As a result, differences in the composition ratio and thickness distribution of a film to be formed on the substrate are increased.

Since the area of the turntable 15 is large, the flows of the reactive gases are more disturbed as the revolving speed of the turntable increases. In mass production, the number of substrates 13 is large, so the area of the turntable 15 needs to be increased, thus increasing the size of the vapor deposition apparatus.

FIGS. 3 and 4 are a general perspective view and a cross-sectional view, respectively, showing another vertical-type vapor deposition apparatus.

In the figures, a shaft 22 for supplying reactive gases is disposed substantially at the center of a reactor tube 21. A susceptor 23 is supported by a plurality of bases 24 arranged around the shaft 22. The bases 24 are fitted to a hub 25 which is rotated by a motor (not shown) to rotate the susceptor 23. On an outer surface of the susceptor 23, there are rotatably disposed susceptor rotors 26 on each of which a substrate 27 is mounted. The periphery of each susceptor rotor 26 frictionally makes contact with a fixed track 28. When the susceptor 23 is rotated, the susceptor rotors 26 are also rotated with respect to the fixed track 28. As a result, the substrates 27 are simultaneously rotated and revolved.

One feature of the vapor deposition apparatuses shown in FIGS. 1 through 4 is the simultaneous rotation and revolution of substrates. However, a common problem was found to exist in the above-mentioned prior arts, according to experiments carried out by the inventors, in that products of reaction adhere to the substrate rotating mechanisms (e.g., the gears 9 and 19, the racks 4a and 14a and the motors 6 and 16 of the apparatuses shown in FIGS. 1 and 2, and the peripheries of the susceptor rotors 26 and the contacting portion of the fixed track 28 of the apparatus shown in FIGS. 3 and 4) exposed to the reactive gases in the reactor tubes, thereby hindering the smooth rotation and revolution of the substrates as time elapses, and thus causing unevenness in the thickness of the film formed on each substrate.

In the apparatus shown in FIGS. 3 and 4, when the susceptor 23 is inductively heated with a high-frequency coil, an induction current flows through the susceptor 23 which is a conductor, and electrical discharge phenomena are caused between the susceptor 23 and the susceptor rotors 26 due to sliding motions between them. As a result, the contacting faces of the susceptor 23 and the susceptor rotors 26 are quickly worn, leading to a deterioration in the durability of the apparatus and thus increasing the need for frequent maintenance. In addition, due to the electrical discharges, high-frequency outputs vary and this destabilizes the temperature of the susceptor 23, which subsequently deteriorates the uniformity of the crystalline thin film formed on each substrate 27.

SUMMARY OF THE INVENTION

An object to the present invention is to provide a vapor deposition apparatus which can form a thin film having a uniform thickness distribution.

Another object of the present invention is to provide a vapor deposition apparatus which can smoothly rotate and revolve substrates on which thin films are formed.

Still another object of the present invention is to provide a vapor deposition apparatus which can prevent products of reaction from adhering to the mechanisms for rotating and revolving substrates on which thin films are formed.

Still another object of the present invention is to provide a vapor deposition apparatus which can improve the rotating characteristics of susceptors.

Still another object of the present invention is to provide a vapor deposition apparatus which can improve the durability of the mechanisms for rotating and revolving substrates.

Still another object of the present invention is to provide a vapor deposition apparatus which can prevent electrical discharging phenomena from happening due to susceptors sliding on a susceptor carrier.

In order to accomplish the objects and advantages mentioned in the above, the present invention provides a vapor deposition apparatus which comprises a reactor vessel, a hollow susceptor carrier rotatably supported substantially at the center of the reactor vessel, a gas supplying port for supplying reactive gases to the reactor vessel, a discharging port for discharging the reactive gases out of the reactor vessel, susceptors rotatably supported by the susceptor carrier and holding substrates thereon respectively, a heater for heating the susceptors to a predetermined temperature, a revolving mechanism for revolving the susceptor carrier so that the substrates are revolved with respect to the reactor vessel, a rotating mechanism for rotating the susceptors to rotate the substrates around themselves, and driving devices for driving the revolving and rotating mechanisms. At least one of the revolving and rotating mechanisms is disposed within the hollow of the susceptor carrier.

With the above-mentioned arrangement, the mechanisms for revolving and rotating the susceptors are arranged within the hollow of the susceptor carrier such that the mechanisms do not make contact directly with the flowing reactive gases. As a result, the products of reaction will not adhere to the mechanisms and, therefore, the susceptors can be stably and smoothly rotated and revolved for long durations.

According to another aspect of the present invention, there is provided a vapor deposition apparatus for introducing reactive gases to a reactor vessel through a gas supplying port to grow new crystals on crystalline substrates disposed in the reactor vessel. The apparatus comprises a susceptor carrier rotatably supported in the reactor vessel, susceptors rotatably supported by the susceptor carrier and on which the crystalline substrates are mounted respectively, a rotating mechanism disposed within the susceptor carrier to rotate the susceptors with respect to the susceptor carrier, and a gas blowing device for blowing a gas which does not influence a crystal growing reaction from the susceptor carrier to the reactor vessel through gaps between the susceptor carrier and the susceptors.

According to this aspect of the present invention, the gas which does not influence the crystal growing reaction is always blown through the gaps between the susceptors and the susceptor carrier so that products of the reaction do not adhere around the gaps, thus maintaining a consistently smooth rotation of the substrates.

According to still another aspect of the present invention, there is provided a vapor deposition apparatus which comprises a reactor provided with an introducing port and a discharging port of reactive gases, a stationary shaft fixed in the reactor, a susceptor carrier rotatable with respect to the stationary shaft, a heater for heating the susceptor carrier, susceptors rotatable with respect to the susceptor carrier and holding crystalline substrates thereon respectively, a driving device for rotating the susceptor carrier such that the crystalline substrates held by the susceptors are revolved with respect to the reactor, and a converting mechanism for converting a motion of the susceptor carrier rotated by the driving device into a motion by which the susceptors and crystalline substrates are rotated around themselves. By operating the heater and supplying reactive gases through the introducing port, crystalline thin films are formed on the crystalline substrates which are revolved and rotated by the driving device. Between the susceptor carrier and the susceptors, there are arranged electric insulating members that make contact with the susceptor carrier and the susceptors through their faces.

According to this aspect of the present invention, the susceptor carrier is rotated by the driving device to revolve the crystalline substrates with respect to the reactor. The rotation of the susceptor carrier is converted by the converting mechanism into a motion which rotates the crystalline substrates around themselves. The susceptor carrier is heated by the heater to heat the crystalline substrates, and the reactive gases are introduced to the reactor through the introducing port to form crystalline thin films on the crystalline substrates.

Between the susceptor carrier and the susceptors, there are arranged the electric insulating members whose surfaces make contact with the susceptor carrier and the susceptors. Therefore, the susceptors do not slide directly on the susceptor carrier. As a result, electrical discharges can be prevented from occurring due to incomplete contact of the susceptors with respect to the susceptor carrier.

These and other objects, features and advantages of the present invention will become apparent from the following descriptions of preferred embodiments taken in conjunction with the accompanying drawings.

DETAILED DESCRIPTION OF THE PREFERRED EMBODIMENTS

Figure 5:
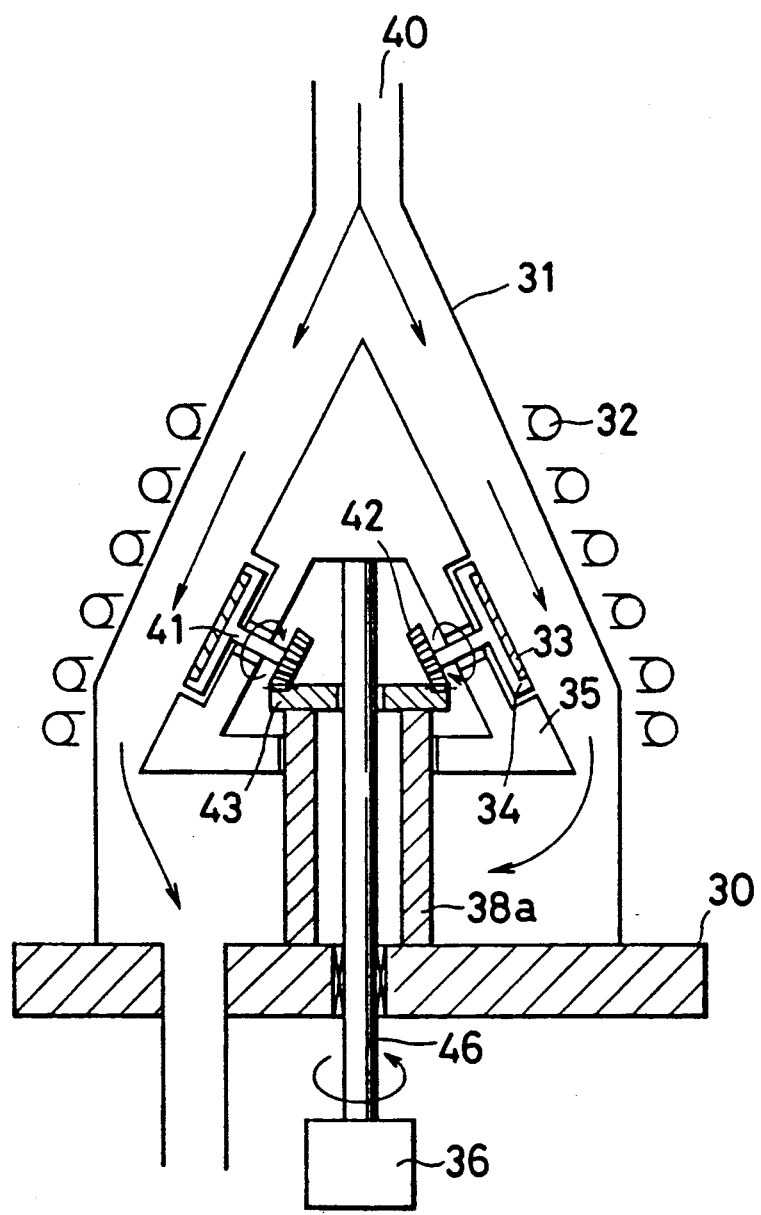
FIG. 5 is a cross-sectional view schematically showing a vapor deposition apparatus according to a first embodiment of the present invention.

FIG. 5 shows a vapor deposition apparatus according to the first embodiment of the present invention. The apparatus comprises a reactor tube 31 within which a hollow revolving susceptor carrier 35 is supported by a rotary shaft 46. To maintain the reactor tube 31 disposed on a base 30 airtight, a seal acting as a bearing is used to rotatably support the rotary shaft 46 with respect to the base 30. The rotary shaft 46 is connected to a motor 36 for rotating and revolving the susceptor carrier 35 through the rotary shaft 46.

The susceptor carrier 35 has, for instance, a polyhedral, pyramidal shape to hold a plurality of substrates. On a peripheral slope of the susceptor carrier 35 there are disposed a plurality of susceptors 34 and substrates 33 such that the susceptors 34 and substrates 33 are substantially in parallel with the flows of reactive gases which flow along the reactor tube 31, i.e., substantially in parallel with an inner wall of the reactor tube 31. The susceptors 34 and substrates 33 are arranged inwardly on the periphery of the susceptor carrier 35. Each of the susceptors 34 is supported by one end of a supporting shaft 41 the other end of which is provided with a bevel gear 42. Each supporting shaft 41 is supported by the susceptor carrier 35 through a bearing such as a slide bearing which will realize the stablest rotation of the supporting shaft 41 under the high temperature conditions (about 800° C.) of a crystal growing process.

The rotary shaft 46 is surrounded by a hollow supporting shaft 38a to which a receiver gear 43 is fixed to engage with the bevel gears 42 of the supporting shafts 41.

By driving the motor 36, the susceptor carrier 35 is rotated to revolve the substrates 33 while the substrates 33 are being rotated around themselves by the actions of the bevel gears 42 and receiver gear 43.

In this arrangement, rotating mechanisms such as the rotary shaft 46, bevel gears 42 and receiver gear 43 are received within a hollow of the susceptor carrier 35 and isolated from a flowing region of the reactive gases to prevent products of reaction from adhering to the rotating mechanisms. As a result, the substrates 33 are always smoothly rotated and revolved.

The susceptors 34 are heated with a high-frequency coil 32 disposed outside the reactor tube 31 to heat the substrates 33 to a predetermined temperature. After that, the reactive gases are supplied from a gas supplying port 40 to grow crystals on the substrates 33. The reactive gases are then discharged through a discharging port 48.

Since the front surface of each of the substrates 33 is substantially in parallel with the inner wall of the reactor tube 31, the reactive gases flow in front of and substantially in parallel with the front surfaces of the substrates 33. Therefore, the substrates 33 will not be influenced by heat convections and vortexes are not caused, thus achieving favorable flows for the reactive gases.

The substrates 33 are arranged in a circumferential direction on the peripheral slope of the susceptor carrier 35 so that the respective substrates 33 are equally distanced from the gas supplying port 40. Therefore, the thickness distributions and component ratios of films formed on the respective substrates 33 will be uniform throughout the films.

Since the front surfaces of the substrates 33 are disposed substantially in parallel with the inner wall of the reactor tube 31, an internal volume of the reactor tube 31 can be reduced by narrowing the gaps between the substrates 33 and the reactor tube 31 to remarkably reduce the quantities of the reactive gases.

Figure 6:
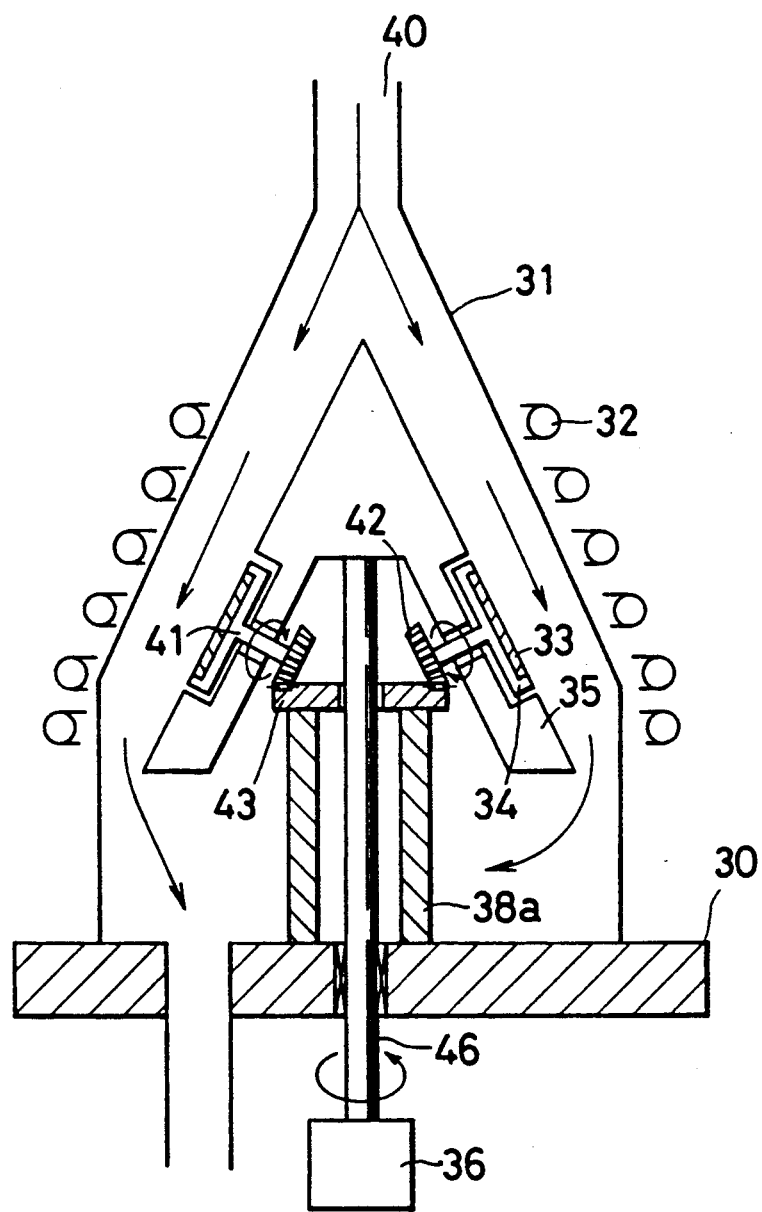
FIG. 6 is a cross-sectional view schematically showing a first modification of the first embodiment shown in FIG. 5.

FIG. 6 is a view showing the first modification of the first embodiment as shown in FIG. 5. As shown in FIG. 6, the lower part of a susceptor carrier 35 is open such that the apparatus is easily assembled. This opening of the susceptor carrier 35 is located on the downstream side of the flows of reactive gases in a reactor tube 31.

Even with the susceptor carrier 35 provided with the opening, products of reaction will not adhere to rotating and revolving mechanisms because the opening is located on the downstream side of the flows of reactive gases. Therefore, the same effect as that of the first embodiment can be obtained with this modification. Due to the provision of the opening, the rotating and revolving mechanisms are easily arranged within a hollow of the susceptor carrier 35 to realize easy assembling and maintenance.

Figure 7:
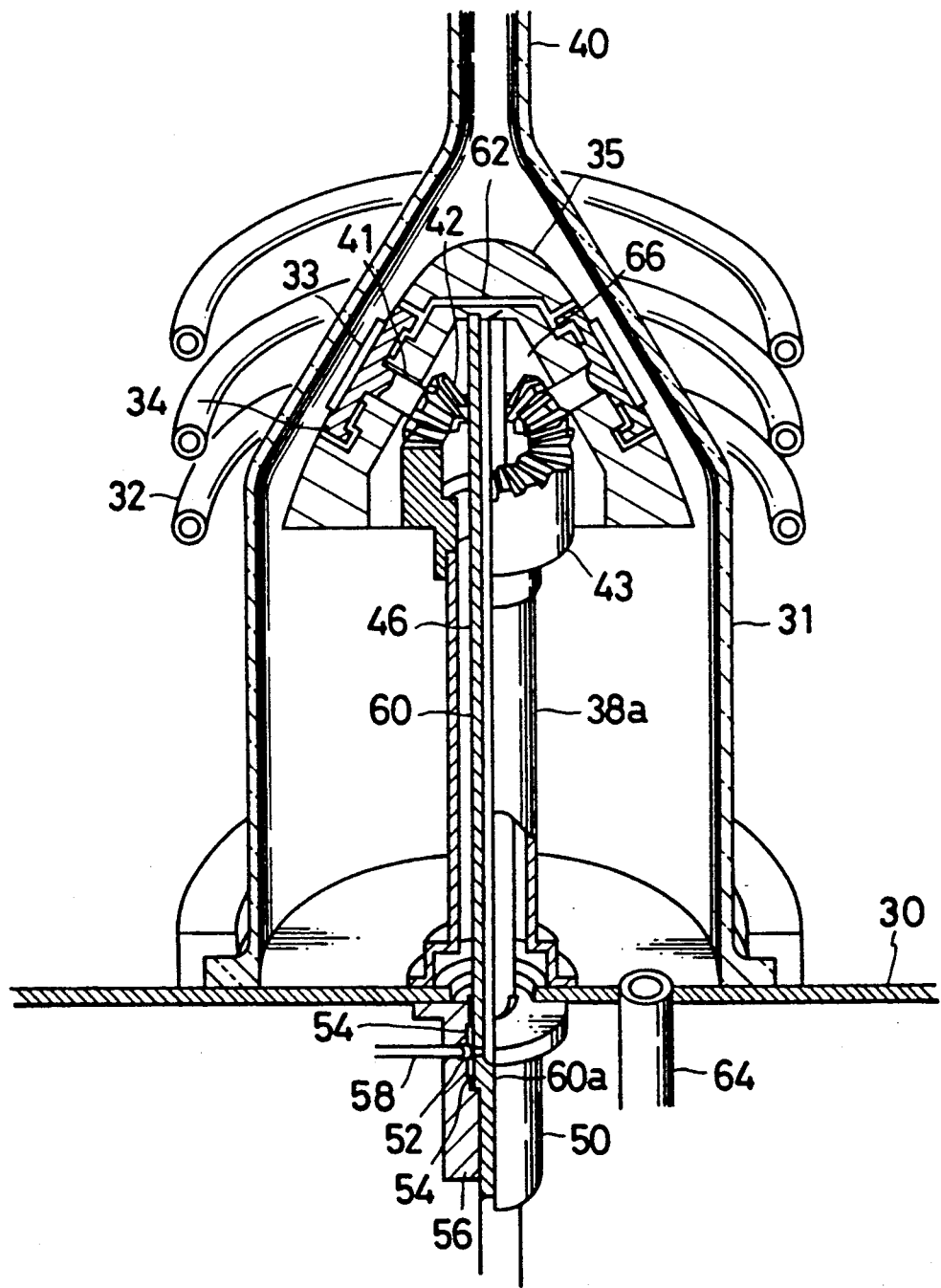
FIG. 7 is a perspective view, partly sectioned, showing a vapor deposition apparatus according to a second embodiment of the present invention.

FIG. 7 shows a vapor deposition apparatus according to the second embodiment of the present invention.

In addition to the components of the apparatus of the first embodiment, the second embodiment apparatus is provided with a purge gas blowing mechanism for blowing a purge gas against rotating and revolving mechanisms to prevent products of reaction from adhering to the mechanisms. In FIG. 7, the parts that are same as those of the first embodiment are represented with like reference numerals to omit their explanations.

The purge gas blowing mechanism comprises a purge gas introducing groove 52 passing through a seal bearing 50 for sealing a reactor tube 31. In the seal bearing 50 and above and below the groove 52, there are arranged seals 54 and a bearing portion 56. A purge gas introducing pipe 58 is connected to the groove 52. A gas passage 60 is formed in a rotary shaft 46 to extend from the vicinity of the groove 52 to the top of the rotary shaft 46. An opening 60a of the gas passage 60 communicates with the groove 52. At the top of the rotary shaft 46, distribution passages 62 are formed to communicate with a susceptor carrier 35 and respective susceptors 34. Crystalline substrates 33 respectively fitted to the susceptors 34 are heated with a high-frequency coil 32.

With this arrangement, reactive gases such as arsine and trimethylgallium (TMG) are supplied through a reactive gas supplying port 40 and are heated together with the susceptors 34. When the reactive gases pass over the crystalline substrates 33 tightly fitted to the peripheral surfaces of the susceptor 34, the gases are decomposed and form crystals of gallium arsenide on the surfaces of the substrates 33.

To obtain uniform crystalline thin films on the crystalline substrates 33 in order to provide satisfactory semiconductor elements, the substrates 33 are rotated and revolved. If the reactive gases flow into the gaps between the susceptors 34 and the susceptor carrier 35, reaction products may become deposited on the susceptors 34 and the susceptor carrier 35 around these gaps, because the susceptors 34 and the susceptor carrier 35 are also heated. If so, the rotating and revolving mechanisms will not be smoothly driven, leading to deterioration in the uniformity of the film thicknesses.

To cope with this problem, the second embodiment of the present invention supplies the purge gas to the groove 52 through the pipe 58. The purge gas is passed through the passage 60 in the rotary shaft 46 and through the distribution passages 62 in the susceptor carrier 35, and is blown into the gaps between the susceptor carrier 35 and the susceptors 34. The purge gas fills the gaps between the susceptor carrier 35 and the susceptors 34, and is blown toward the surface of the susceptor carrier 35 and discharged together with the reactive gases through a gas discharging port 64.

As a result, the reactive gases do not flow into the gaps between the peripheries of the susceptors 34 and the susceptor carrier 35, and so the crystalline substrates 33 are always smoothly rotated and revolved. Even if the concentrations of the reactive gases vary, remarkably uniform crystalline films can be grown on the crystalline substrates 33 to improve the yields.

In this embodiment, the purge gas is a gas which does not influence the growth of crystals and is a carrier gas or an inert gas ($H_2$, $N_2$ or Ar). The purge gas is supplied in small quantities so as not to disturb the flows of reactive gases.

Figure 8:
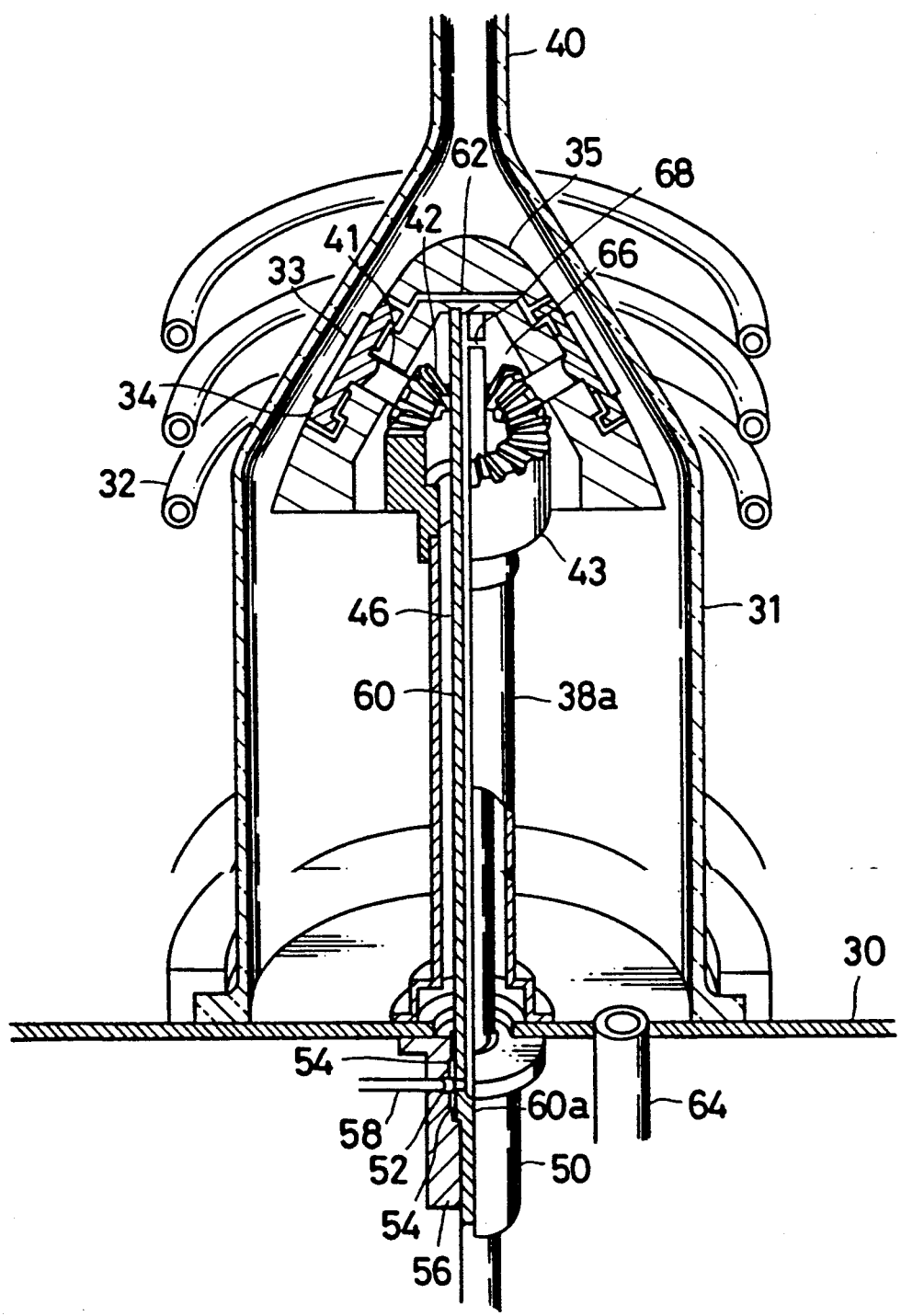
FIG. 8 is a perspective view, partly sectioned, showing a modification of the second embodiment as shown in FIG. 7.

FIG. 8 shows a modification of the second embodiment.

According to this modification, a communication passage 68 is formed at the top of the gas passage 60 of the rotary shaft 46 of the second embodiment. The communication passage 68 connects the passage 60 to an inner space 66 of the susceptor carrier 35.

By virtue of the communication passage 68, the purge gas is directly guided to the inside of the susceptor carrier 35 to completely prevent the products of reaction from adhering to the rotating and revolving mechanisms disposed inside the susceptor carrier 35.

Although both the distribution passages 62 and the communication passage 68 have been provided for the embodiment shown in FIG. 8, the distribution passages 62 may be omitted to provide only the communication passage 68. Even with the communication passage 68 only, the inside of the susceptor carrier 35 is filled with the purge gas to prevent the products of reaction from adhering to the rotating mechanisms. If a large part of the purge gas is discharged through the lower part of the susceptor 35, the purge gas will not disturb the flows of the reactive gases.

Figure 9:
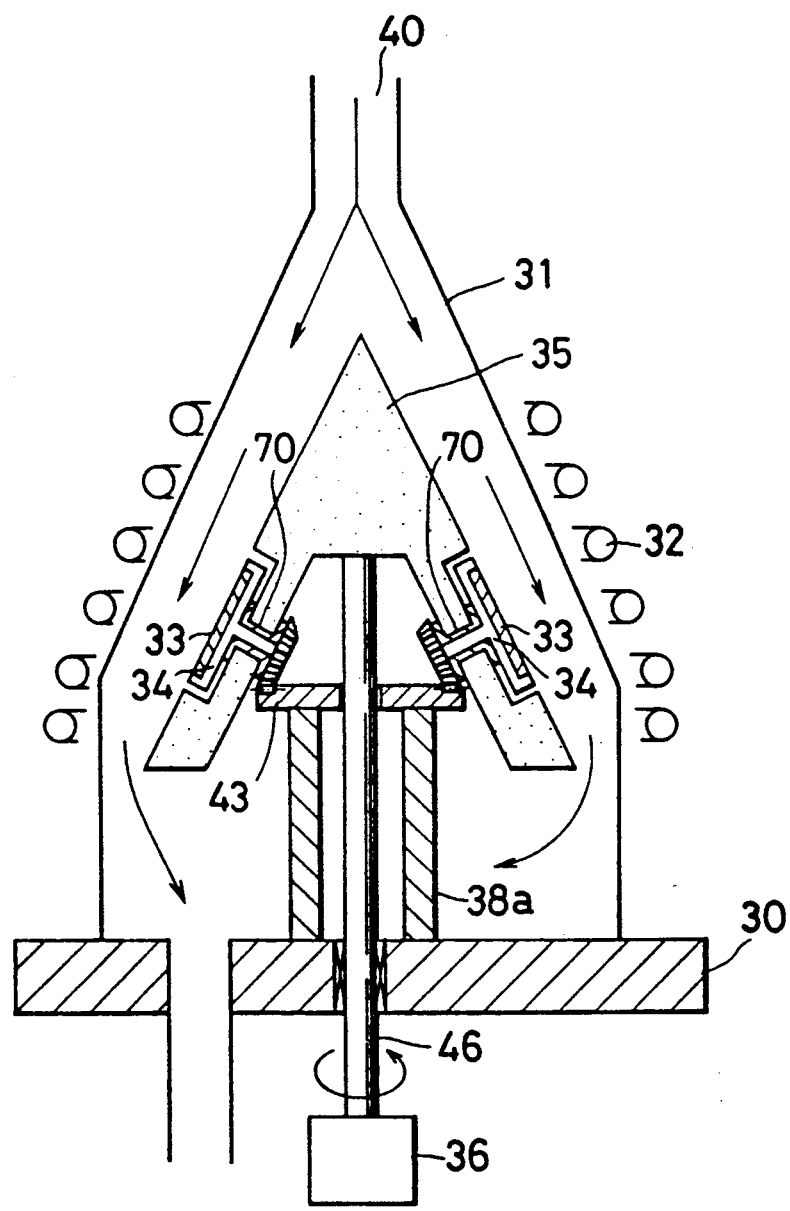
FIG. 9 is a cross-sectional view schematically showing a vapor deposition apparatus according to a third embodiment of the present invention.
Figure 10:
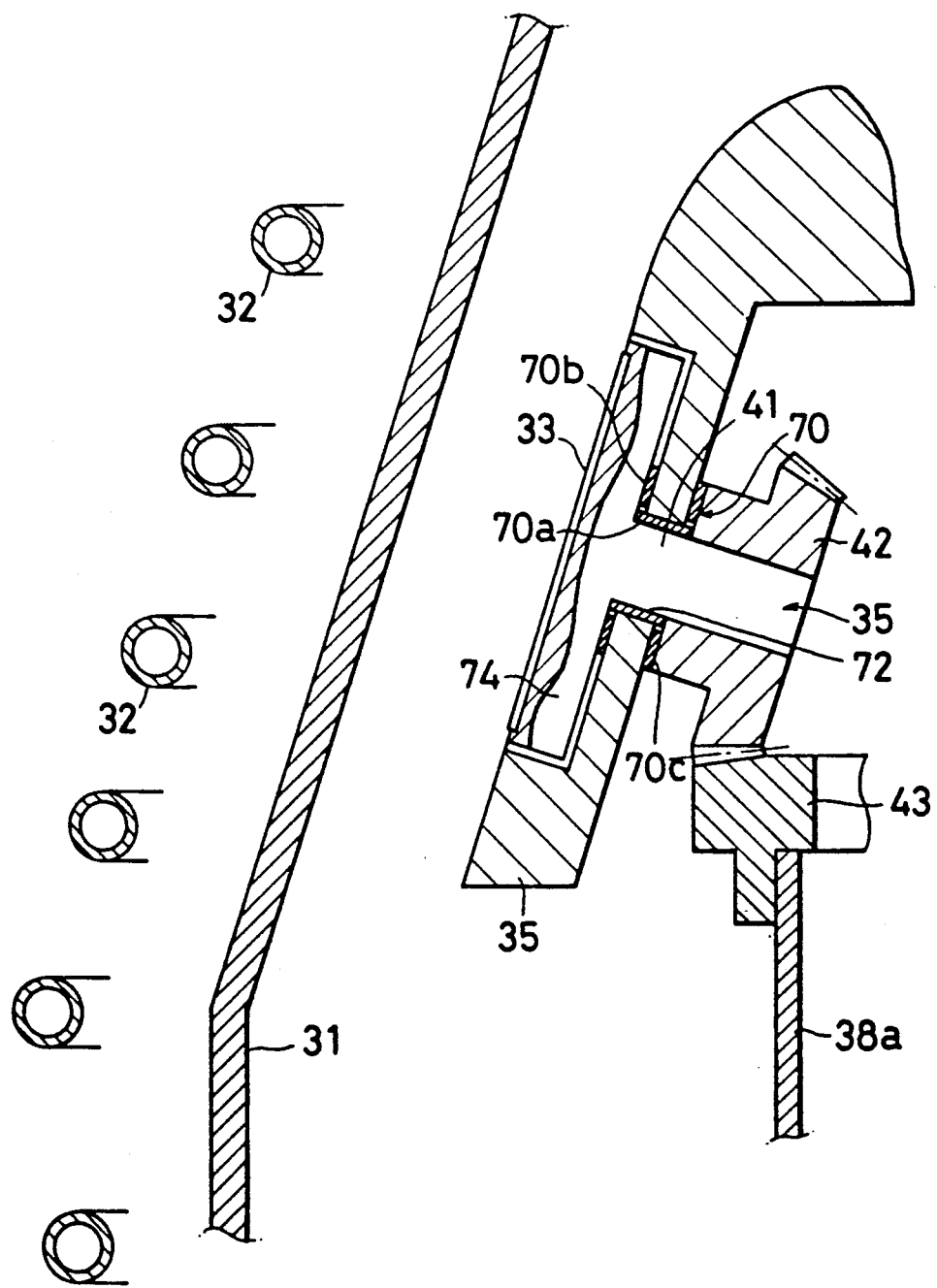
FIG. 10 is an enlarged view showing part of the third embodiment as shown in FIG. 9.
Figure 11:
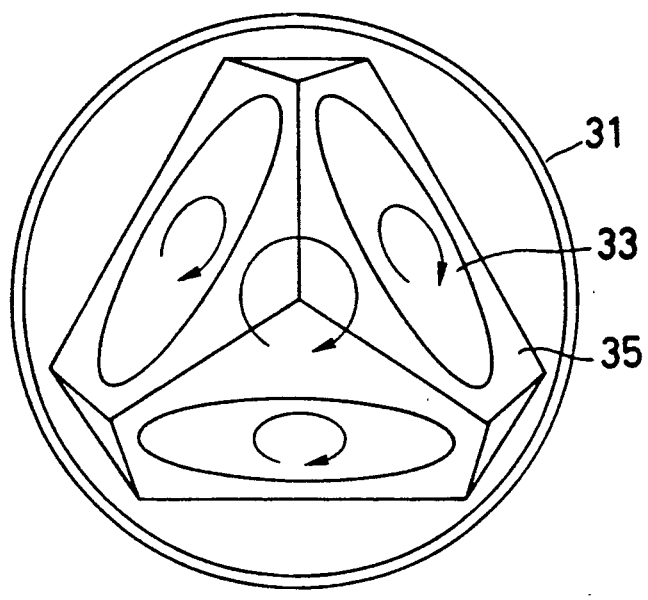
FIG. 11 is an explanatory view showing a rotating and revolving state of susceptors of the third embodiment.

FIGS. 9 through 11 show a vapor deposition apparatus according to the third embodiment of the present invention.

The third embodiment shown in FIG. 9 is provided with an electric insulating member 70 between the susceptor carrier 35 and each of the susceptors 34 of the first embodiment to prevent electrical discharge phenomena. In the figure, the same components as those of the first embodiment are represented with like reference numerals to omit their explanations.

FIG. 10 shows the details of the third embodiment. The electric insulating member 70, made of, for instance, boron nitride, is disposed between the susceptor carrier 35 and each of the susceptors 34. Each insulating member 70 comprises a cylindrical bearing portion 70a, a first plate portion 70b and a second plate portion 70c.

The bearing portion 70a is interposed between an insertion hole 72 of the susceptor carrier 35 and a supporting shaft 41 of the susceptor 34. The first plate portion 70b is interposed between the susceptor carrier 35 and a main portion 74 of the susceptor 34. The second plate portion 70c is interposed between the susceptor carrier 35 and a bevel gear 42 of the susceptor 34. The susceptor carrier 35 and the susceptor 34 make contact with the surfaces of the insulating member 70, and are therefore separated from each other by the insulating member 70 lying between them.

Around the periphery of a reactor tube 31, there is disposed a high-frequency coil 32. When the high-frequency coil 32 is energized, an induction current flows through the susceptor carrier 35 to heat the susceptor carrier, thus heating the substrates 33.

An operation of the third embodiment will be described.

The rotary shaft 46 is rotated by a motor 36 to rotate the susceptor carrier 35 and to revolve the substrates 33 with respect to the reactor tube 31. At this time, the bevel gears 42 of the susceptors 34 are rotated with respect to a receiver gear 43 to rotate the substrates 33 around the supporting shafts 41 (FIG. 11). Since the insulating members 70 act as bearings between the susceptor carrier 35 and the susceptors 34, the susceptors 34 are smoothly rotated.

The susceptor carrier 35 is heated with the high-frequency coil 32 to heat the substrates 33. While the substrates 33 are being rotated and revolved as mentioned in the above, the temperature of the substrates 33 is increased to a predetermined value. Then, reactive gases such as $(CH_3)_3Ga$ are introduced from an introducing port 40 to grow thin crystalline films on the substrates 33.

When the susceptor carrier 35 is heated with the high-frequency coil 32, induction currents flow through conductive members, i.e., the susceptor carrier 35, susceptors 34, the receiver gear 43 and bevel gears 42.

However, by virtue of the electric insulating members 70 disposed between the susceptor carrier 35 and the susceptors 34, the conductive members do not directly slide on each other thereby preventing electrical discharges. Since electric discharges are suppressed, high-frequency outputs will not vary, and so the temperature of the susceptor carrier 35 is stabilized, the substrates 33 are smoothly rotated and revolved, and the thin crystalline films uniformly formed on the substrates 33.

The insulating members 70, made of, for instance, boron nitride, have low coefficients of friction so that the susceptor carrier 35 and the susceptors 34 are not worn easily, thus improving their durabilities and reducing their maintenance frequencies.

Engaging portions between the receiver gear 43 and the bevel gears 42 are disposed in a hollow of the susceptor carrier 35 in such a way that the reactive gases hardly influence these portions, and so the products of reaction hardly adhere to the engaging portions. Since the products of reaction do not adhere to the engaging portions of the receiver gear 43 and the bevel gears 42, the substrates 33 are smoothly rotated and revolved to form uniform, thin crystalline films on the substrates 33.

Each of the substrates 33 is arranged substantially parallel to an inner wall of the reactor tube 31 so that the reactive gases flow in parallel with the surfaces of the substrates 33. Therefore, the generation of heat convections can be suppressed to prevent the generation of vortexes and turbulence, and thereby achieve satisfactory gas flows. Since the substrates 33 are disposed substantially parallel to the inner wall of the reactor tube 31, an internal volume of the reactor tube 31 can be reduced to conserve the reactive gases and reduce the overall size of the reactor tube 31.

The present invention is not limited to the above mentioned embodiments, instead various modifications may be possible without departing from the scope of the present invention. For instance, the electric insulating members 70 can be constituted with two components, and many kinds of electric insulating material may substituted in place of boron nitride. Further, the bearing portion 70a of each insulating member 70 may comprise a slide bearing or a ball bearing. The slide bearing is most preferable under high temperature conditions. Friction wheels maybe substituted for the gears of the converting mechanisms for generating rotational motions. The shape of the susceptor carrier 35 is not limited to only the polyhedral pyramid, instead it may be a polyhedral pyramid frustum, a cone, a conical frustum, or a cylinder, with the only requirement being subjected that the shape can provide the same effect as the polyhedral pyramid.

The shape of the reactor tube 31 may be a cylinder. In this case, gaps between the substrates 33 and the reactor tube 31 will be gradually narrowed toward the downstream side of the direction of gas flow, thus widening the selection range of conditions, such as the pressure and flow rate of reactive gases, to obtain a uniform film thickness distribution.

FIGS. 12 through 18 show the modifications of the first embodiment.

Figure 12:
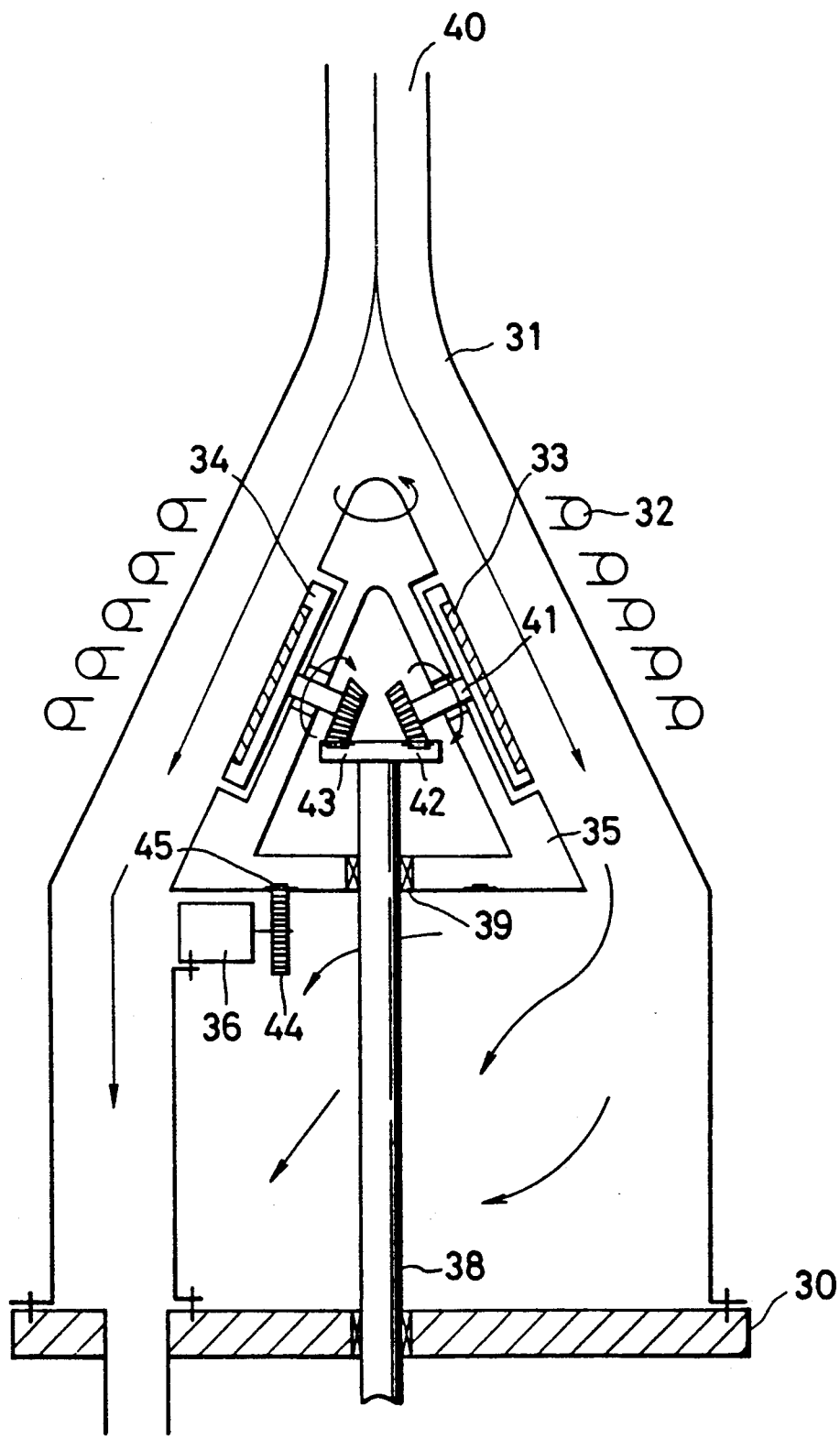
FIGS. 12 through 15 are cross-sectional views schematically showing second through fifth modifications, respectively, of the first embodiment as shown in FIG. 5.

FIG. 12 shows the second modification of the first embodiment. In a reactor tube 31, there is disposed a hollow susceptor carrier 35. The susceptor carrier 35 is supported by a supporting shaft 38 and is rotatable due to a bearing 39. The susceptor carrier 35 has, for instance, a polyhedral pyramid shape to hold a plurality of substrates 33. The substrates 33 are fitted to susceptors 34 which are disposed on a peripheral slope of the susceptor carrier 35. The substrates 33 and susceptors 34 are inwardly disposed on the peripheral slope of the susceptor carrier 35 and substantially in parallel with the flows of reactive gases flowing along the reactor tube 21, i.e., substantially in parallel with an inner wall of the reactor tube 31. Each of the susceptors 34 is supported by one end of a supporting shaft 41. The other end of the supporting shaft 41 is connected to a bevel gear 42 which engages with a receiver gear 43 fixed to the supporting shaft 38.

A pinion gear 44 is fitted to a motor 36 and engaged with a rack 45 formed at the lower part of the susceptor carrier 35. By driving the motor 36, the susceptor carrier 35 is rotated to revolve and rotate the substrates 33 due to the actions of the bevel gears 42 and receiver gear 43.

In this arrangement, the motor 36, pinion gear 44 and rack 45 of the mechanisms for rotating and revolving the substrates 33 are disposed at the lower part of the susceptor carrier 35 apart from the substrates 33 over which the reactive gases flow. Therefore, products of reaction do not adhere to the mechanisms.

The bevel gears 42 and receiver gear 43 for rotating and revolving the substrates 33 are arranged in a hollow of the susceptor carrier 35 so that the products of reaction do not adhere to the gears 42 and 43. The bevel gears 42 and receiver gear 43 can be easily assembled into the susceptor carrier 35 constituted with halved portions.

Figure 13:
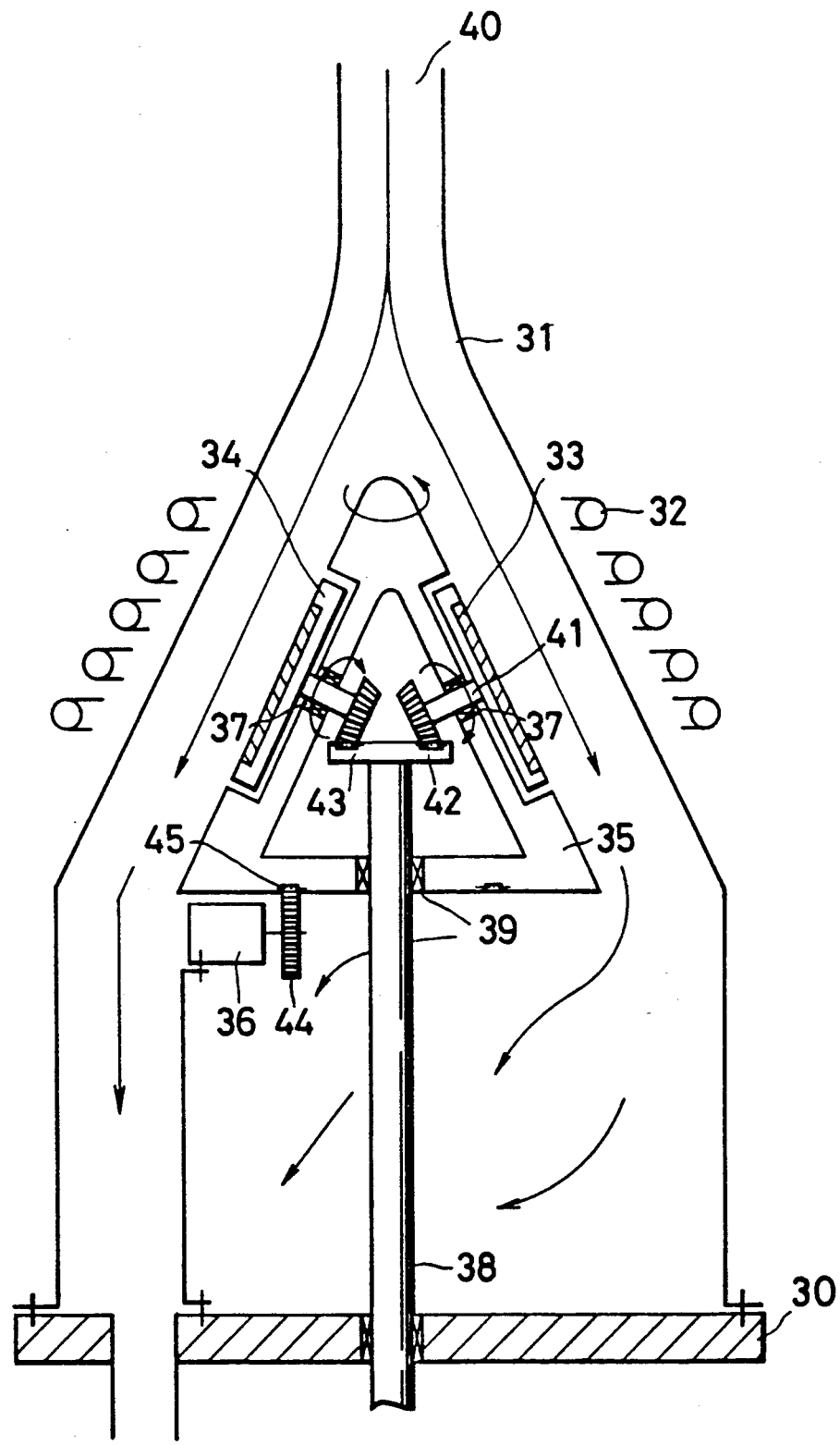

FIG. 13 shows the third modification of the first embodiment. A bearing 37 which also acts as a seal closes a gap between the susceptor carrier 35 and each of the susceptor supporting shafts 41 of the apparatus shown in FIG. 12 such that the reactive gases do not enter into the inside of the susceptor carrier 35.

Figure 14:
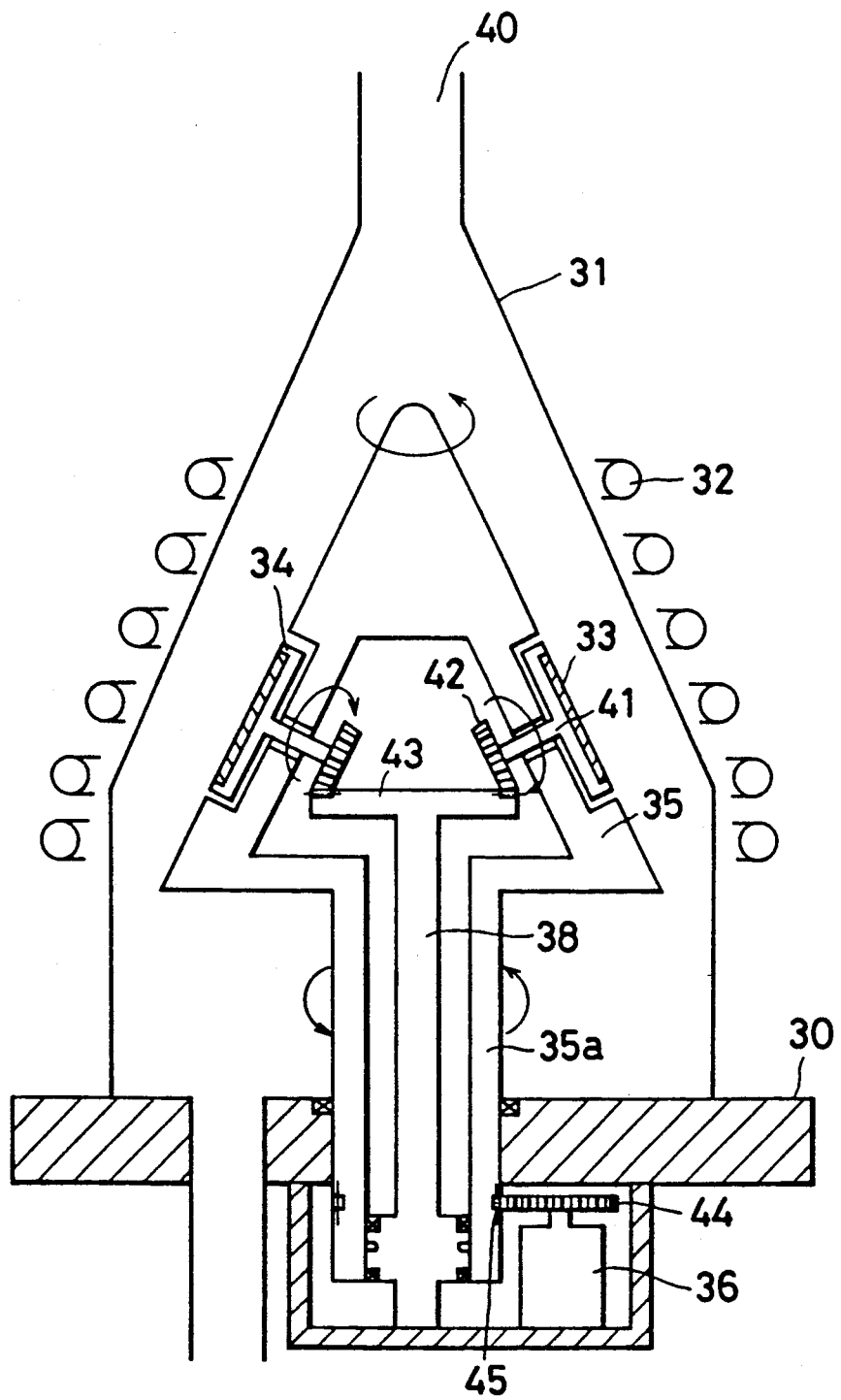

FIG. 14 is a view showing the fourth modification of the first embodiment. The fourth modification differs from the second modification in that the motor 36 for rotation and revolution is disposed outside the reactor tube 31. A supporting shaft 38 is stationary, and a rotary shaft 35a provided integrally with a susceptor carrier 35 is rotated to rotate and revolve the substrates 33.

Since the motor 36 for rotation and revolution is disposed outside the reactor tube 31, the products of reaction are completely prevented from adhering to the rotating mechanisms, and the motor 36, etc., can be maintained from the outside of the reactor tube 31.

Figure 15:
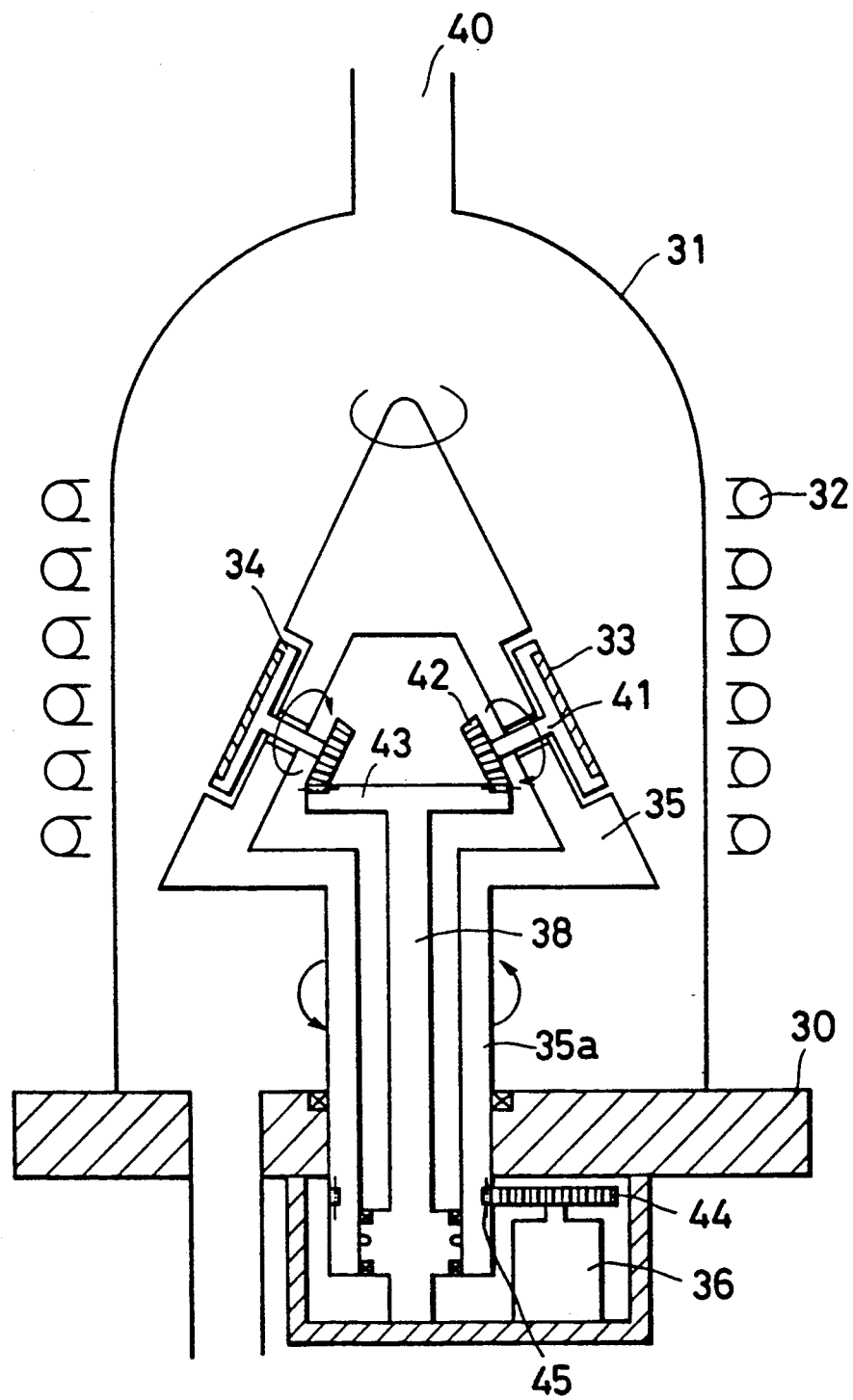
Figure 16:
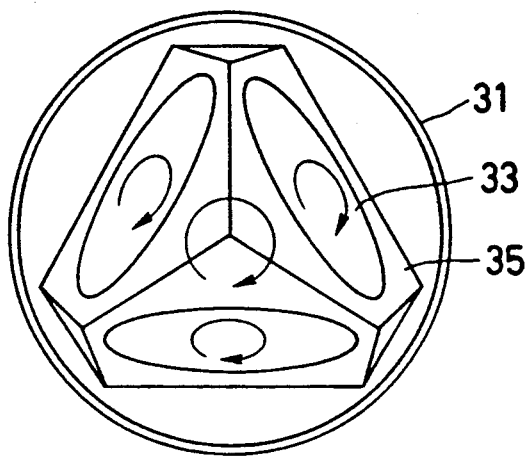
FIG. 16 is an explanatory view showing a rotating and revolving state of susceptors of the first embodiment.

FIG. 15 is a view showing the fifth modification of the first embodiment. In the fifth modification, reactive gases do not flow in parallel with the surfaces of substrates 33. Even so, a uniform film thickness distribution can be realized by smoothly rotating and revolving the substrates 33 as shown in FIG. 16.

Figure 17:
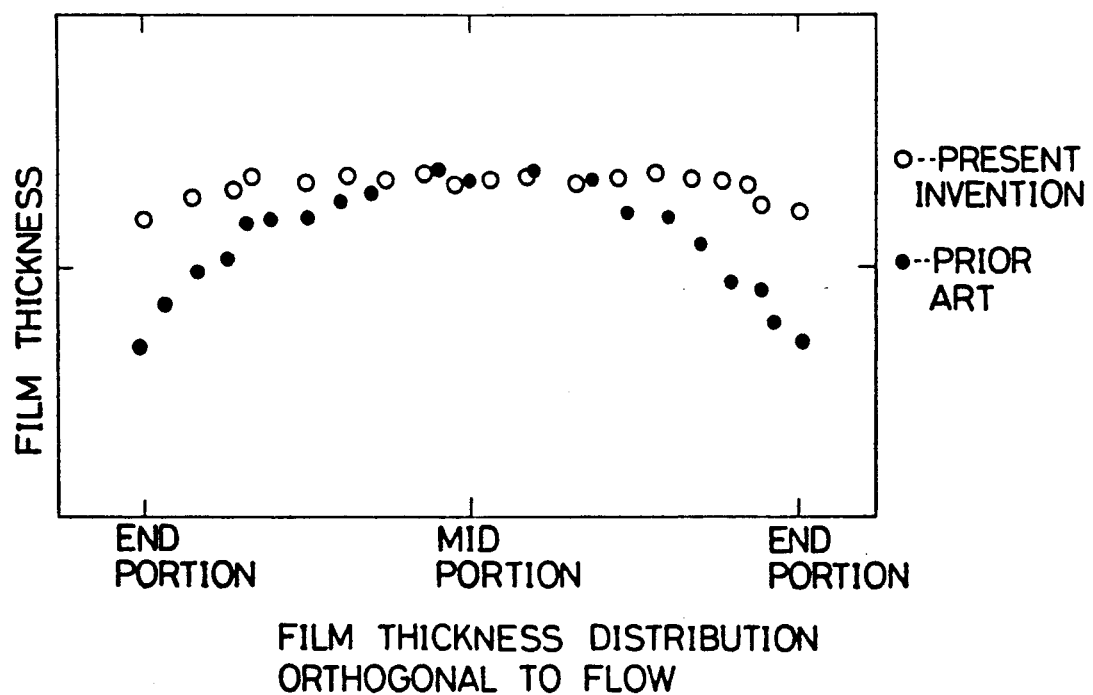
FIG. 17 is a distribution diagram showing a comparison of film thicknesses of thin films prepared by the vapor deposition apparatuses of the present invention and of the prior art.

FIG. 17 shows measurement results of the thickness distributions of films prepared according to the present invention compared with the conventional deposition method. The measurements obtained by using the conventional method were based on the assumption that the rotation of a substrate on which a film is to be formed is hindered due to the products of reaction adhering to the rotating mechanisms of the substrate. Namely, the measurement process by the conventional method was carried out only by revolving the substrate. In the figure, open symbols represent the thickness distributions of a film prepared according to the present invention, and black symbols correspond to those of a film prepared according to the conventional method.

Figure 18A:
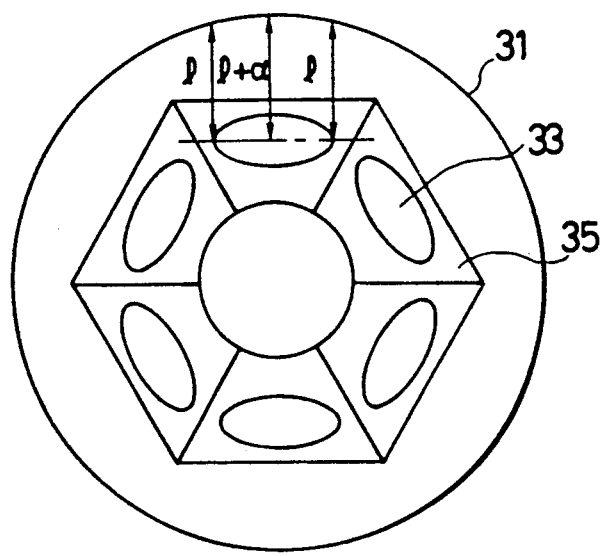
FIG. 18 is an overhead view schematically showing the susceptors of the first embodiment.
Figure 18B:
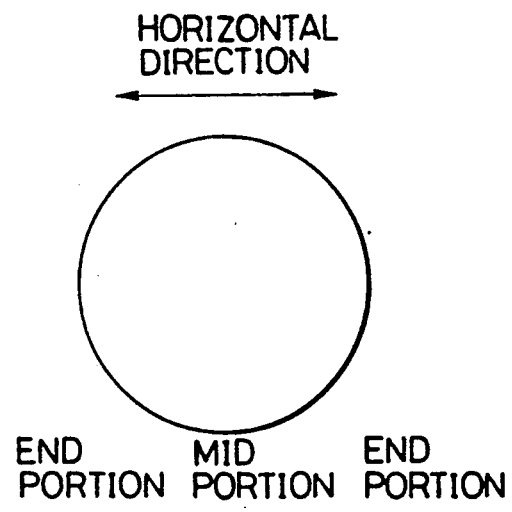

FIG. 18 is a conceptual view schematically showing a vapor deposition apparatus in which a substrate is obliquely held on a susceptor. The reactor tube of the apparatus has a circular shape along a horizontal cross section. Irrespective of the shape of the susceptor, the horizontal distance from an end portion of the substrate to an inner surface of the reactor tube is "1" and the horizontal distance from a middle portion of the substrate to the inner surface of the reactor tube is "1 + a". Therefore, the flow rate of reactive gas at the middle portion is larger than that at the end portion. Accordingly, if the substrate is not rotated, the film thickness at the middle portion of the substrate becomes larger than that at the end portion.

However, if the substrate is smoothly rotated as in the case of the present invention, horizontal end portions of the substrate will successively come to the middle position so that differences in the film thickness distribution are averaged to realize a uniform film thickness.

The distance from the reactive gas supplying port to the proximal end of the substrate differs from the distance from the gas supplying port to the distal end of the substrate by one diameter of the substrate. This may lead to differences in the concentration of a reactive gas at the proximal and distal locations, thus affecting the thickness of the film to be formed on the substrate. Such differences can also be averaged by smoothly rotating and revolving the substrate to realize a uniform film thickness distribution.

By smoothly rotating the substrates 33, unevenness in film thickness distribution that may be caused on the substrates 33 due to manufacturing errors of the reactor tube 31, susceptor carrier 35, etc., can be prevented. Thus, uniformity of the substrates 33 is also secured. This is advantageous particularly in the mass production of thin films.

Compared with conventional apparatuses which hold substrates horizontally, a larger number of substrates can be held without increasing a diameter of the reactor tube by arranging the substrates in a sloped fashion to minimize the size of the apparatus.

As shown in FIG. 15, gaps between the substrates 33 and the reactor tube 31 may be narrowed toward the downstream side of the flows of reactive gases, taking into account changes in the concentration of the reactive gases due to the growth of crystals. With this arrangement, the selection range of pressure, flow rate, etc., to obtain a uniform film thickness distribution is widened.

In the third through fifth modifications of the first embodiment, it is possible to add the purge gas blowing mechanism of the second embodiment or the electric insulating member for preventing electrical discharges of the third embodiment to the modifications.

The present invention is not limited by the embodiments and modifications described in the above, instead various modifications and alterations will be possible without departing from the scope of the present invention.

Figure 1:
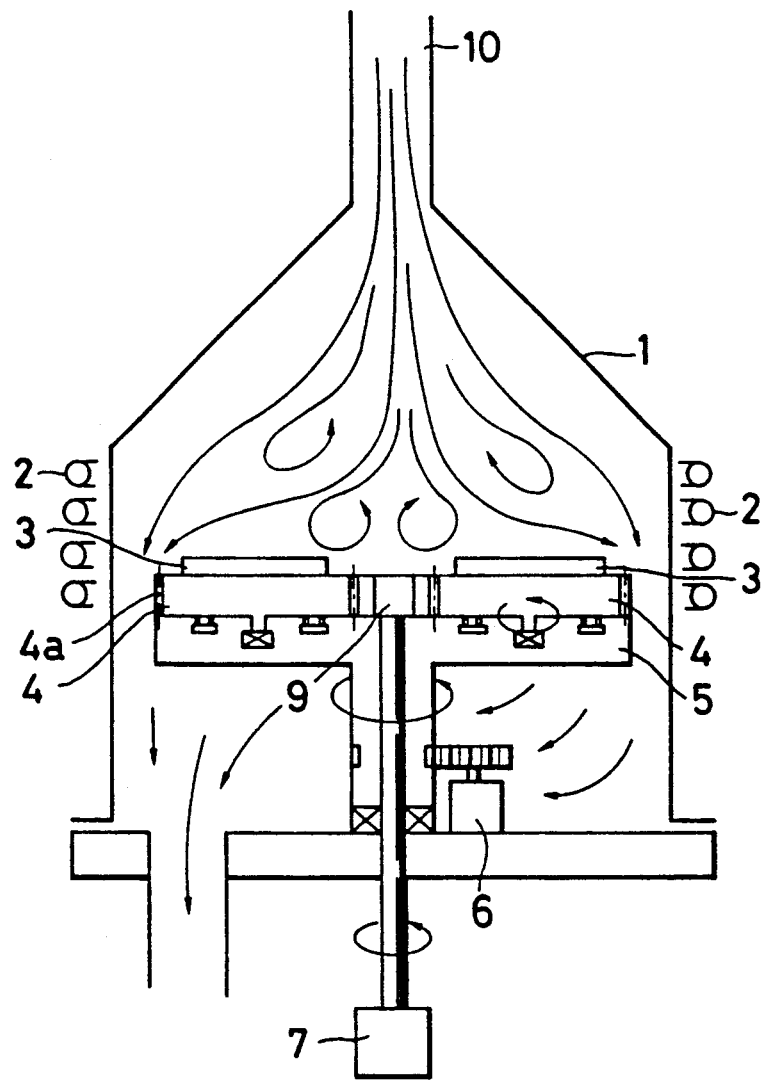
FIG. 1 is a cross-sectional view schematically showing a vertical-type vapor deposition apparatus according to a prior art.
Figure 2:
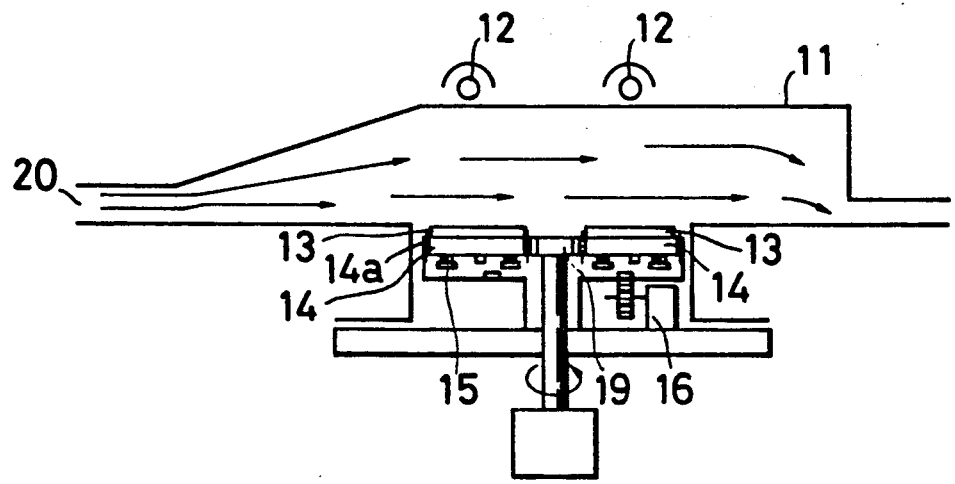
FIG. 2 is a cross-sectional view schematically showing a horizontal-type vapor deposition apparatus according to a prior art.
Figure 3:
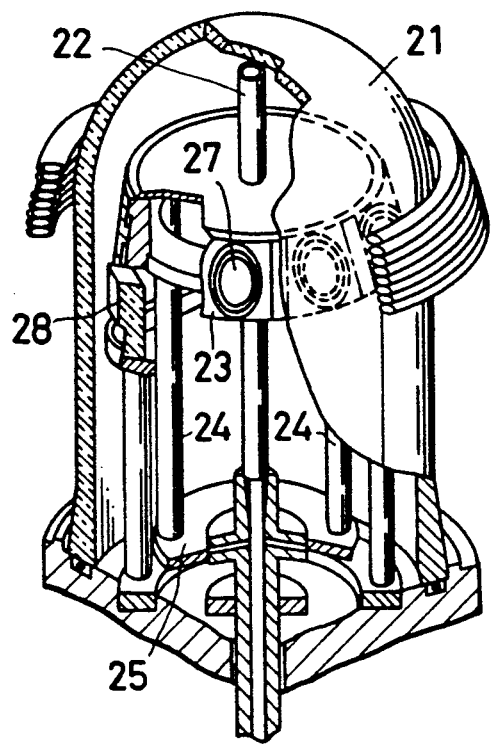
FIGS. 3 and 4 are a perspective view and a cross-sectional partial view, respectively, showing another vertical-type vapor deposition apparatus according to a prior art.
Figure 4:
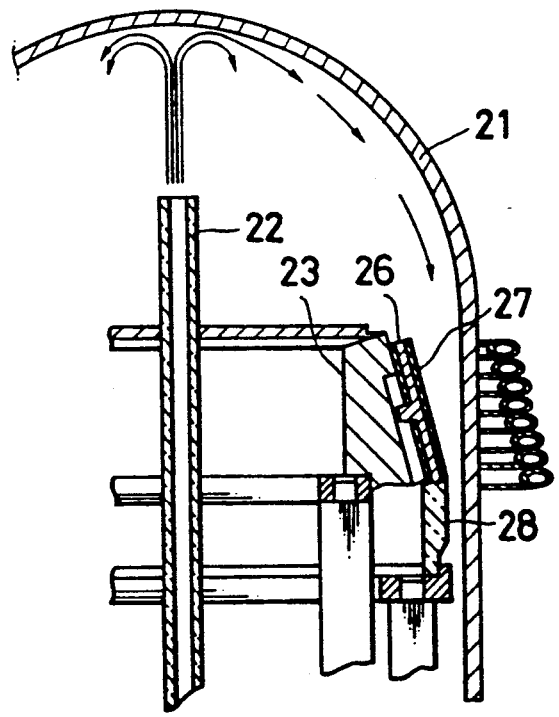

For instance, the shape of the susceptor carrier is not limited to just the polyhedral pyramid and the polyhedral pyramid frustum. On the contrary, it can be a cone, a conical frustum, or a cylinder as that of the prior art shown in FIGS. 3 and 4, with the requirement that the susceptor carrier be hollow enough to accommodate rotating and revolving mechanisms within it such that products of reaction can be prevented from adhering to these mechanisms.

Although only the bevel gear and receiver gear of the rotating mechanism have been disposed inside the susceptor carrier, the revolving mechanism can also be disposed inside the susceptor carrier.

In summary, according to the present invention, mechanisms for rotating and revolving substrates are smoothly rotated, without products of reaction becoming adhered to the mechanisms, to uniformalize film thickness distributions of the substrates.

According to the present invention, a purge gas is blown into the gaps formed at the rotating and sliding portions of a susceptor carrier and susceptors so that products of reactive gases are not deposited around the gaps, which keeps the gaps clean. As a result, the susceptors are smoothly rotated. Therefore, the thickness of a crystalline film formed on a crystalline substrate will be remarkably uniform.

Further, according to the present invention, an electric insulating member is disposed between a susceptor carrier and each of susceptors. The surfaces of each insulating member make contact with the susceptor carrier and the susceptor such that the abrasion of the susceptor carrier and the susceptors is suppressed to improve their durabilities. Therefore, the frequency of servicing is reduced to realize easy maintenance. When the susceptors are heated with high-frequency heaters, electrical discharges between the susceptor carrier and the susceptors are suppressed by the insulating members to reduce variations in high-frequency outputs. Therefore, the temperature of the susceptors is stabilized, and uniform, thin crystalline films are formed on the substrates.

Various modifications will become possible for those skilled in the art after receiving the instructions of the present disclosure without departing from the scope thereof.

What is claimed is:

1. A chemical vapor deposition apparatus for forming thin films on substrates with reactive gases by rotating and revolving the substrates while heating the substrates in a reactor vessel, comprising:
   (a) a hollow susceptor carrier rotatably disposed inside the reactor vessel, said hollow susceptor carrier having an opening on a downstream side in relation to the reactive gas flow;
   (b) susceptors rotatably disposed on said susceptor carrier to hold the substrates respectively;
   (c) means for rotating said susceptor carrier; and
   (d) means located within a hollow of said susceptor carrier for rotating said susceptors with respect to said susceptor carrier.

2. The chemical vapor deposition apparatus as claimed in claim 1, wherein said susceptor carrier rotating means comprises driving means for rotating said susceptor carrier such that said substrates held by said susceptors are revolved with respect to the reactor vessel, and said susceptor rotating means comprises a converting mechanism for converting a rotating motion of said susceptor carrier rotated by said driving means into a motion for rotating said susceptors together with the substrates around themselves.

3. The chemical vapor deposition apparatus as claimed in claim 2, wherein the converting mechanism of said susceptor rotating means is received within said hollow of said susceptor carrier.

4. The chemical vapor deposition apparatus as claimed in claim 1, wherein said susceptor rotating means is disposed within the hollow of said susceptor carrier.

5. The chemical vapor deposition apparatus as claimed in claim 1, wherein said susceptors are rotatable with respect to said susceptor carrier through slide bearings.

6. The chemical vapor deposition apparatus as claimed in claim 4, wherein said susceptor carrier is arranged such that the front surfaces of the substrates held by said susceptors are substantially in parallel with the direction of the reactive gas flow in the reactor vessel.

7. The chemical vapor deposition apparatus as claimed in claim 4, wherein said susceptor carrier is arranged such that the front surfaces of the substrates held by said susceptors are substantially in parallel with an inner wall of the reactor vessel.

8. The chemical vapor deposition apparatus as claimed in claim 2, wherein said driving means of said susceptor carrier rotating means comprises a driving motor.

9. The chemical vapor deposition apparatus as claimed in claim 1, further comprising electric insulating members disposed between said susceptor carrier and said susceptors to contact with said susceptor carrier and said susceptors.

10. The chemical vapor deposition apparatus as claimed in claim 9, further comprising a high-frequency heater for heating said susceptor carrier.

11. The chemical vapor deposition apparatus as claimed in claim 10, wherein said insulating members are made of boron nitride.

12. A chemical vapor deposition apparatus comprising:
- a reactor vessel for receiving a reactive gas in order to form a stream of said reactive gas therein;
- a substrate holder located in said stream for supporting a substrate to be coated in a side of said holder which is located along and exposed to said stream;
- a mechanism provided in an opposite side of said substrate holder located apart from said stream in order to revolve said substrate; and
- an energy source for activating said reactive gas in order to carry out deposition on said substrate,
- wherein said opposite side is opened to the downstream of said stream.

13. The apparatus of claim 13 wherein said substrate holder is a hollow pyramid opened to the downstream.

14. The apparatus of claim 13 wherein said stream is formed between said hollow pyramid and said vessel.

* * * * *